United States Patent [19]

Tega et al.

[11] Patent Number: 4,711,015
[45] Date of Patent: Dec. 8, 1987

[54] APPARATUS FOR HANDLING AND ASSEMBLING AXIAL ELECTRONIC COMPONENTS ON PRINTED CIRCUIT CARDS

[75] Inventors: Ezio Tega; Fabrizio Piccini; Marco Mazzini; Raffaello Magi, all of Arezzo, Italy

[73] Assignee: Metalmeccanica Gori & Zucchi M.G.Z, S.p.A., Italy

[21] Appl. No.: 786,875

[22] Filed: Oct. 11, 1985

[30] Foreign Application Priority Data

Oct. 17, 1984 [IT] Italy .................................. 9514 A/84
Apr. 19, 1985 [IT] Italy .................................. 9392 A/85

[51] Int. Cl.$^4$ .......................................... H01R 43/04
[52] U.S. Cl. .................................... 29/566.2; 29/566.3; 29/741; 140/105
[58] Field of Search ................. 29/564.2, 566.2, 566.1, 29/566.3, 739, 741; 140/105, 140, 147; 227/76, 84

[56] References Cited

U.S. PATENT DOCUMENTS

| 2,748,388 | 6/1956 | Cardani | 29/566.3 |
| 2,978,707 | 4/1961 | Runciman | 29/741 |
| 3,577,847 | 5/1971 | Scranton | 29/566.1 |
| 3,593,404 | 7/1971 | Ragard | 29/566.1 |
| 4,529,083 | 1/1985 | Storimans | 140/105 |

FOREIGN PATENT DOCUMENTS 2120583 12/1983 United Kingdom .................. 29/741

Primary Examiner—Z. R. Bilinsky
Attorney, Agent, or Firm—Hopgood, Calimafde, Kalil, Blaustein & Judlowe

[57] ABSTRACT

Apparatus for predisposing, handling and assembling axial electronic components (C, P) (or other elements) on printed circuit cards and for equivalent uses, which includes cutting tools (34) and bending tools (88) for, respectively, cutting and bending the rheophores (R) as well as for retaining the shaped component, which all operate in a same and single station; its transfer to the operative station being carried out by the mobile hand of a robot whose body (50) carries some of said tools.

6 Claims, 26 Drawing Figures

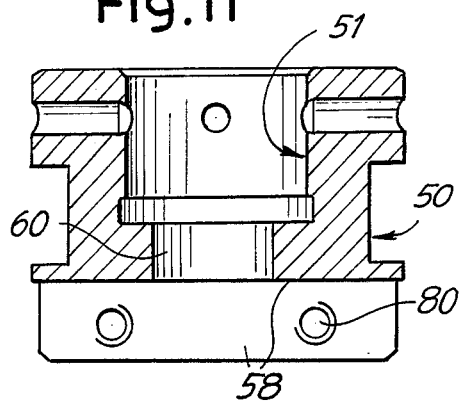
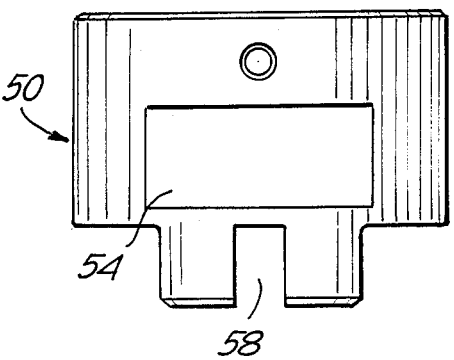
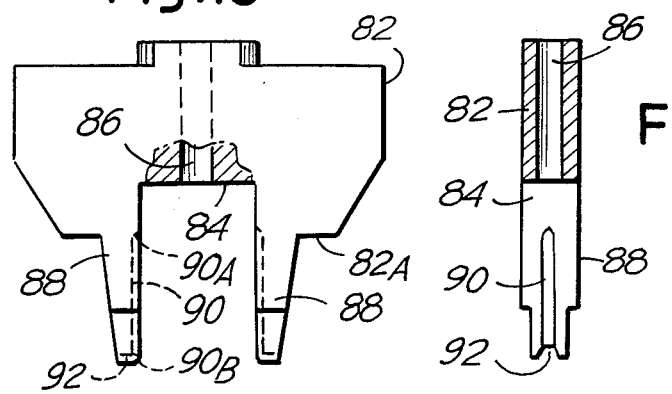
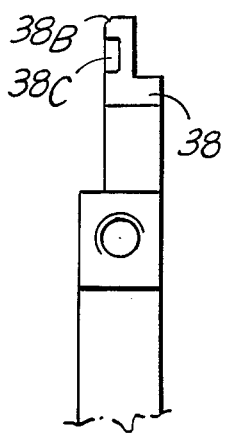
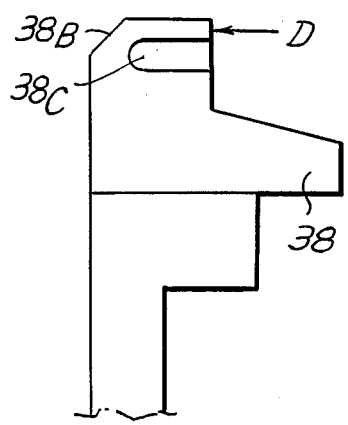
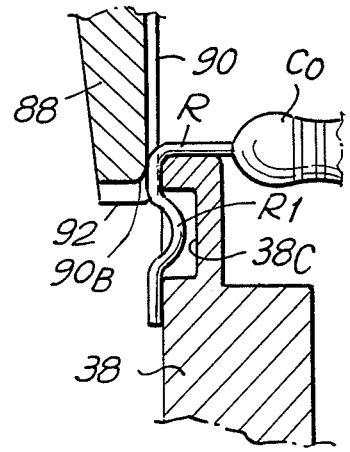

APPARATUS FOR HANDLING AND ASSEMBLING AXIAL ELECTRONIC COMPONENTS ON PRINTED CIRCUIT CARDS

DESCRIPTION

The invention relates to an apparatus for presetting, handling and assembling axial electronic components (or other elements) on printed circuit cards and for equivalent uses. In these components, the wires or rheophores (leads) must be cut to measure and bent with parallel lengths to be inserted into holes of the card.

According to the invention, the apparatus comprises, substantially, tools prearranged for the cutting and bending of the rheophores as well as for the engagement of the shaped component, which operate in a same and single station; its transfer to the operative station is effected by the mobile hand of a robot which carries some of said tools.

Practically, the mobile hand may include: a bending member with two appendixes apt to bend the rheophores, through the cooperation of countertools in fixed position to which the components are individually fed; said appendixes are capable of retaining the compnent whose bent rheophores press on the facing inner edges of them. Said facing inner edges have, advantageously, gride and retaining channels and, at the ends of said appendixes, channels are provided for the centering of the rheophores.

On the bending member and along its appendixes, a block slides driven by an axial actuation system carried by the mobile hand in order to make the shaped component slide so as to insert its rheophores into the holes of the printed circuit cards or the like. Said sliding block may have projections capable of substantially acting in axial direction on the bent and parallel lengths of the rheophores.

The apparatus may include a contrasting, shaped member—facing the card holes at the opposite side where the mobile hand moves—to deform the rheophore ends being pushed by the block, so as to retain the component even prior to the welding. The sliding block has a stem with an adjustable ledge to set the travel of said block.

In a practical embodiment of the invention, the tools of the mobile hand are carried by a body which can be engaged to the end of a robot's arm, said body presenting a channel seat for the bending member in order to give rise, with equal bodies, to a plurality of tools or mobile hands that can be selectively withdrawn from the robot's arm. The cutters for the rheophores may be carried by guide members on the fixed part of the cutting and bending station and are activated by the tool or mobile hand as it is approached for the bending.

According to another embodiment of the invention, the advancement and cutting device comprises an articulation operated by the robot's head and the pertinent tool, for determining the advancement of the pieces with the approach of the tool to the operative position and just before such operation.

Practically, the articulation may comprise a device for the unidirectional, intermittent, angular advancement of wheels having teeth and recesses which engage the pieces to make them advance of one pitch every time.

Said articulation comprises, advantageously, an elastic means able to allow the continuation of the travel of the first portion of the articulation—after the advancement of pieces has taken place—and thus allowing the pertinent operations on the fed piece which is to be picked up; an adjustable stop is provided in order to set the travel of the second portion of said articulation. More particularly, said articulation may include two levers being coaxial and interconnected by spring means to allow the continuation of the angular displacement of one lever after the other has been halted by the stop.

The pieces may be fed in form of a tape—especially a double tape—to which the pieces are engaged, especially through parts that are excluded upon the cutting operation. Alternatively, the pieces may be individually fed to the wheels having teeth and recesses and, from these, to rack means or the like which transfer them up to the operative position, said means being provided with reciprocating motion.

The invention will be better understood by a reading of the following description in conjunction with the accompanying drawing which shows a practical, non limitative exemplification of the invention itself. In the drawing.

Figure 10:
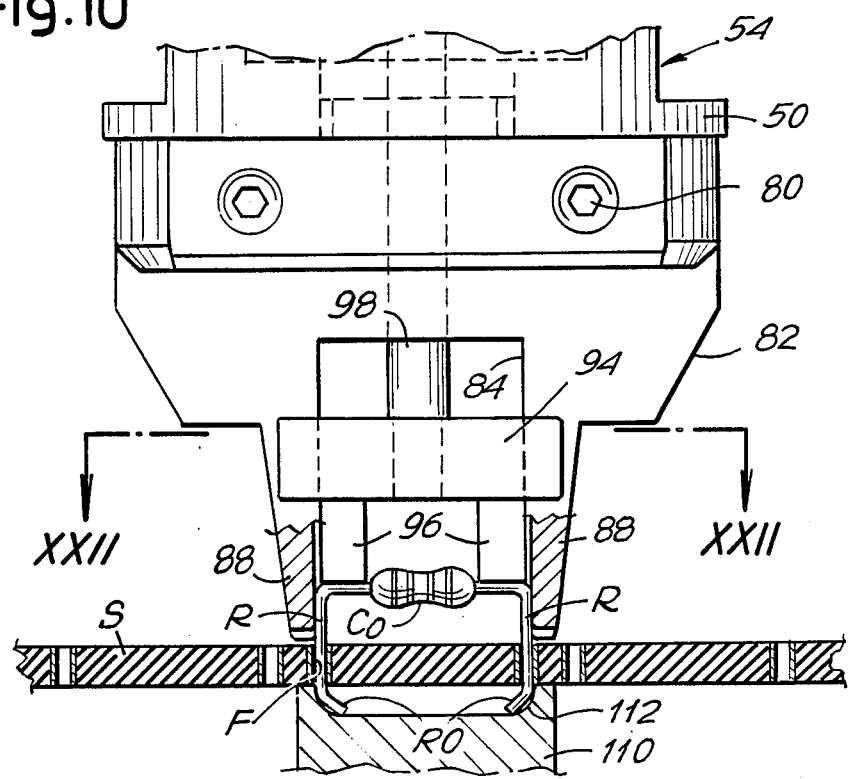
Figure 18:
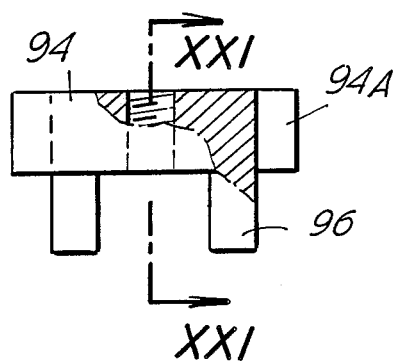
Figure 21:
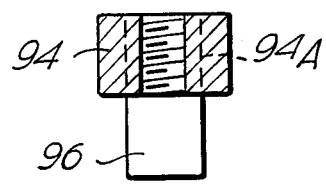
Figure 19:
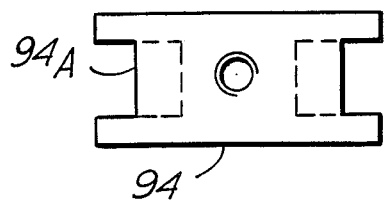
Figure 20:
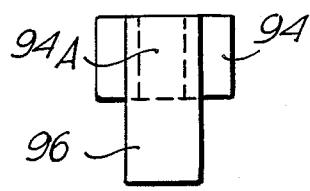
Figure 22:
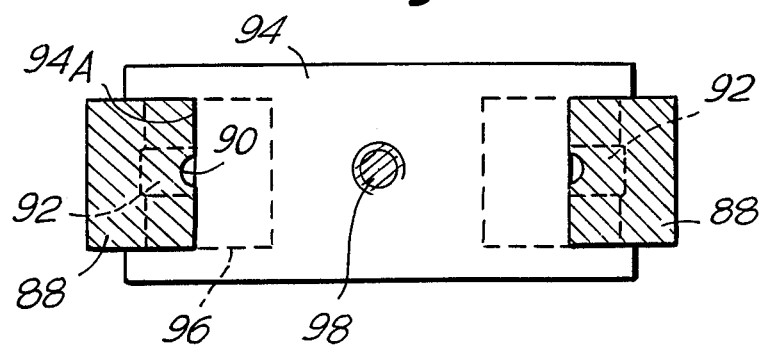
Figure 23:
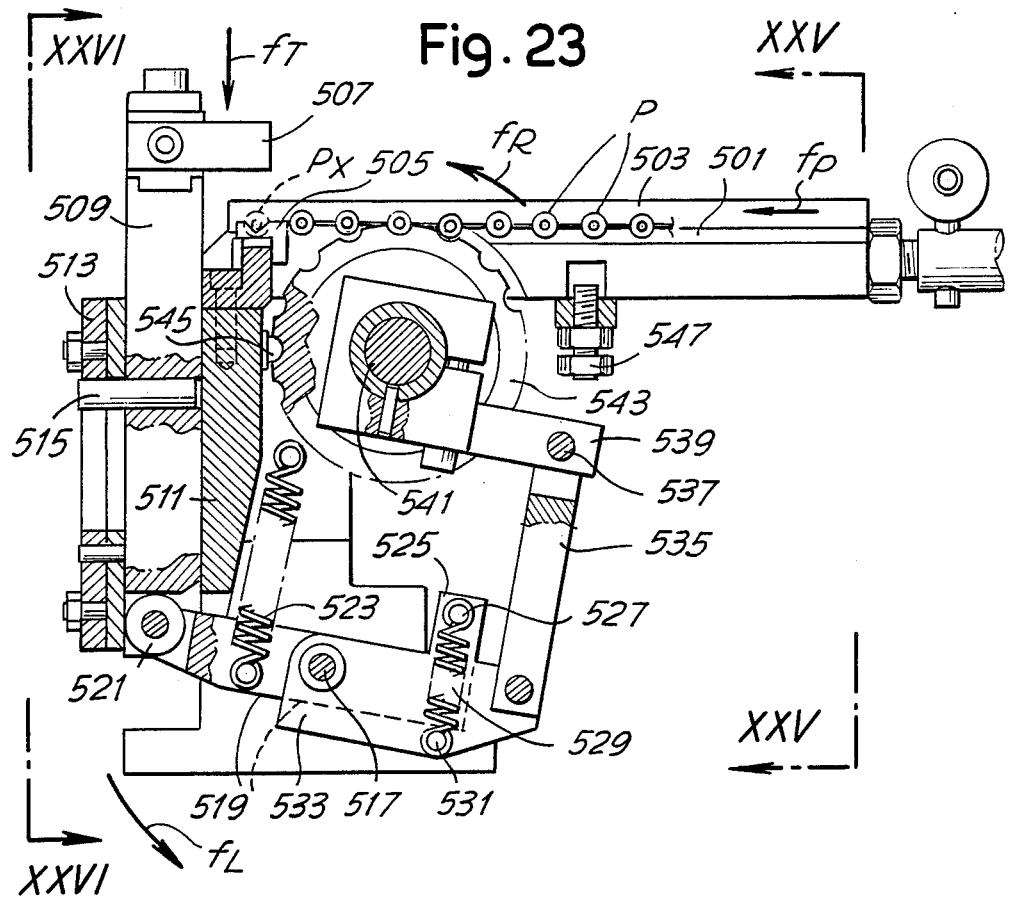
Figure 24:
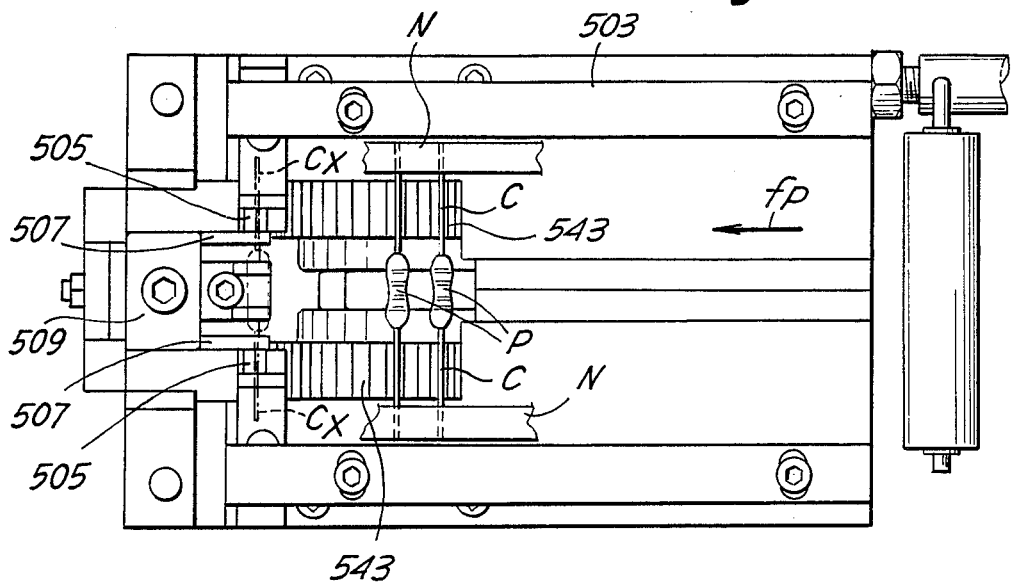
Figure 25:
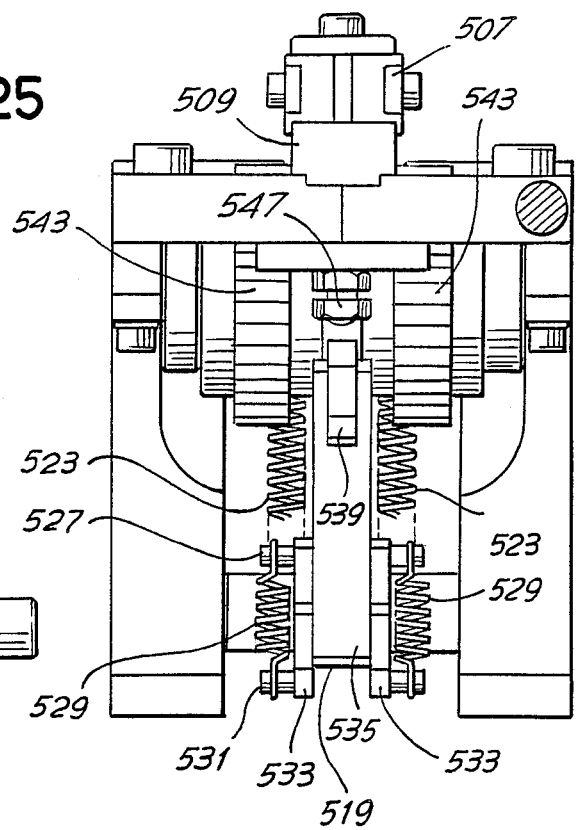

FIGS. 11 and 12; 13 and 14; 15 and 16 show in two views, two components of the mobile hand, appointed for the bending, and a contrasting member to operate the bending;

FIG. 17 shows through a greatly enlarged detail, how the components of FIGS. 13 and 15 cooperate;

FIGS. 18, 19, 20 and 21 show a thrust member for operating the insertion into the card holes, according to three views and in the section on line XXI—XXI of FIG. 18;

FIG. 22 shows an enlarged section on line XXII—XXII of FIG. 10;

FIG. 23 shows a longitudinal section of the advancement and cut device according to a different embodiment;

FIG. 24 shows a plan view of said different embodiment;

FIG. 25 shows a view from line XXV—XXV of FIG. 23; and

Figure 26:
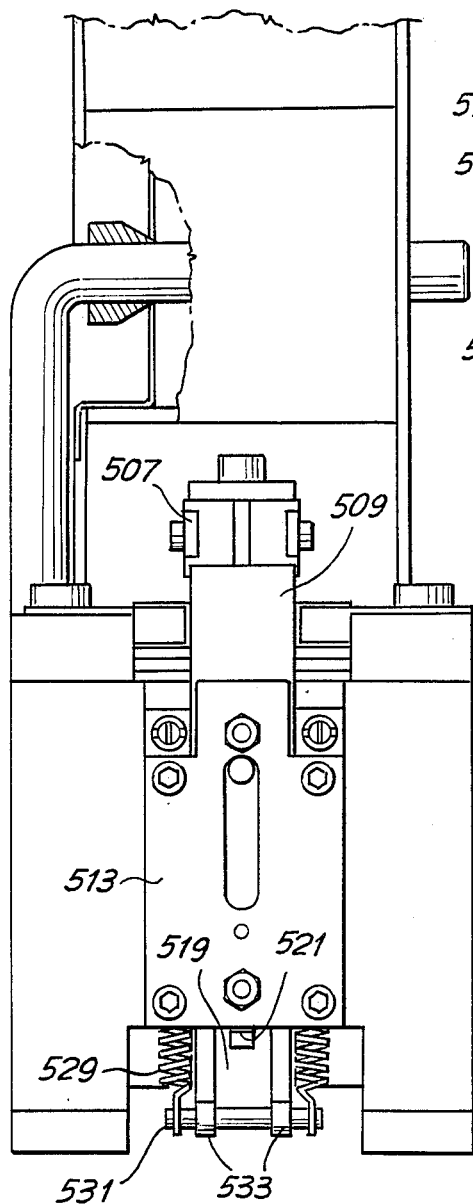

FIG. 26 shows a view from line XXVI—XXVI also of FIG. 23.

Figure 1:
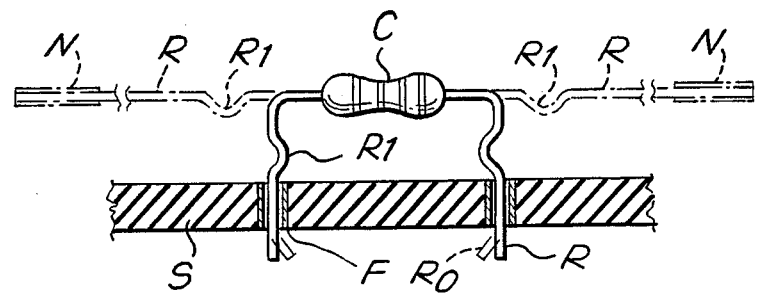
FIG. 1 shows a component which can be handled by the present apparatus and already presented on to the printed circuit card.

The apparatus according to the invention is for the preparation to the mounting of the so-called "axial" electronic components which include a body C and two coaxial and opposite rheophores R, substantially linear and made up of copper (or similar) wires, capable of being easily cut and bent; these axial components are fed to the apparatus packaged by a pair of adhesive tapes N which engage, with constant pitch, the ends of two rheophores R of a plurality of parallely disposed components (FIG. 1). The individual rheophores R of the subsequent components are bent so as to have their ends parallel to each other, in order to be inserted into holes F of a printed circuit card.

Figure 2:
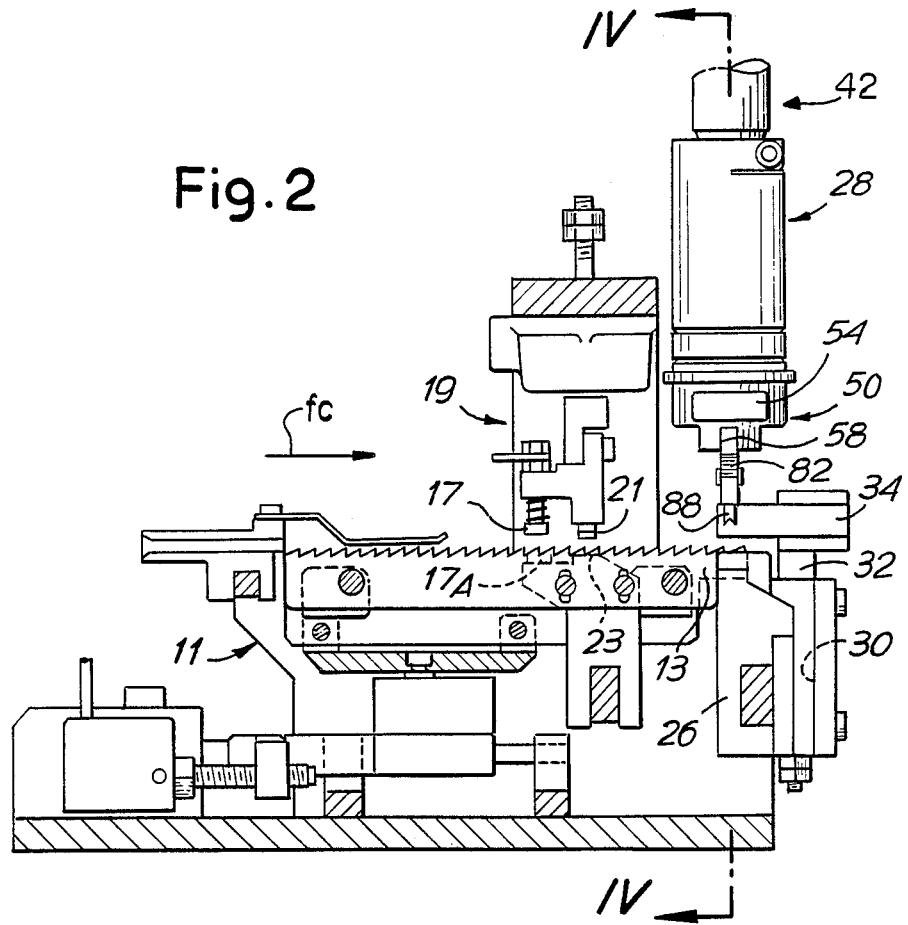
FIG. 2 shows a schematic view in vertical, longitudinal section.
Figure 3:
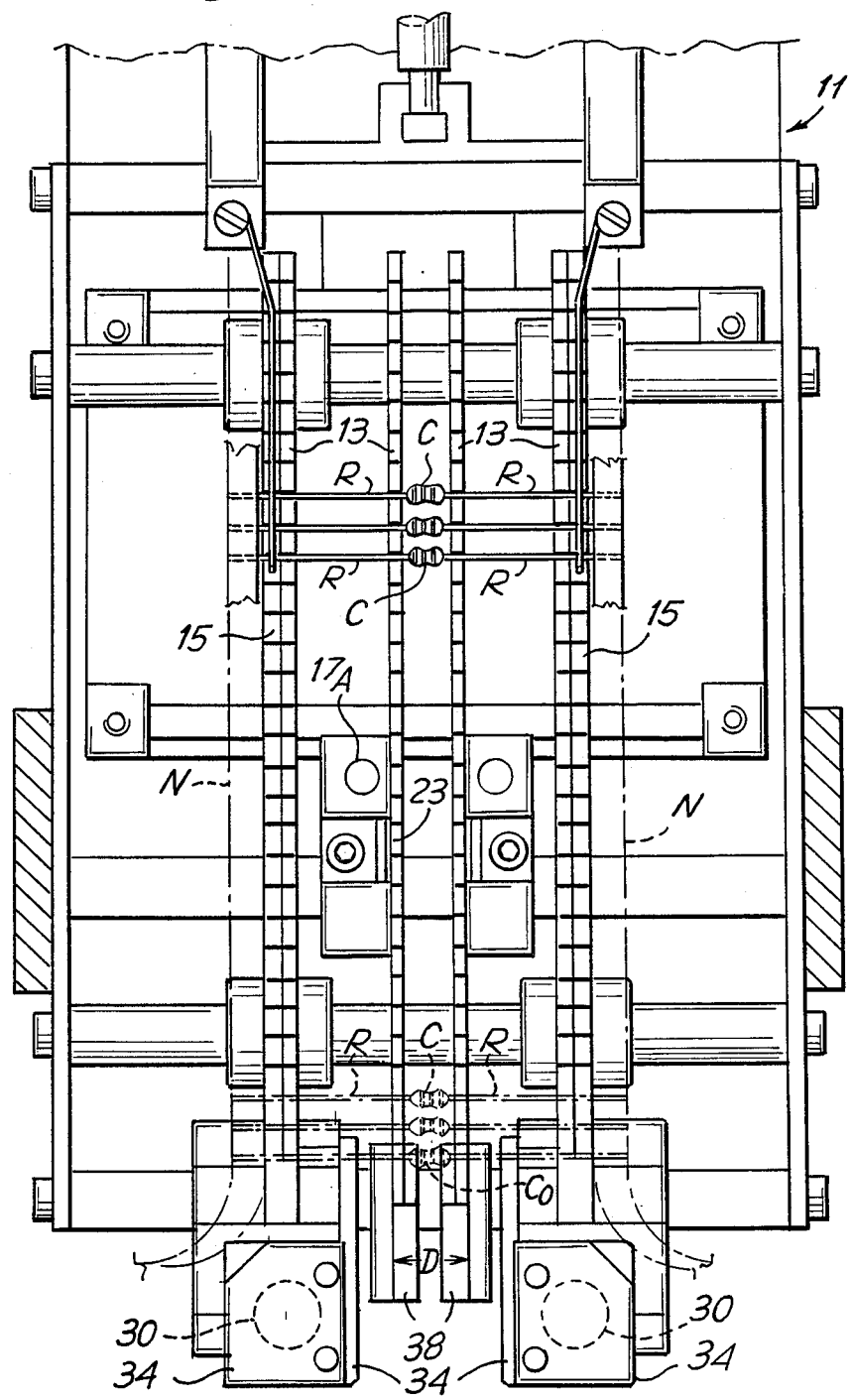
FIG. 3 shows a plan view of the lower portion of the feeding, cutting and bending apparatus.
Figure 4:
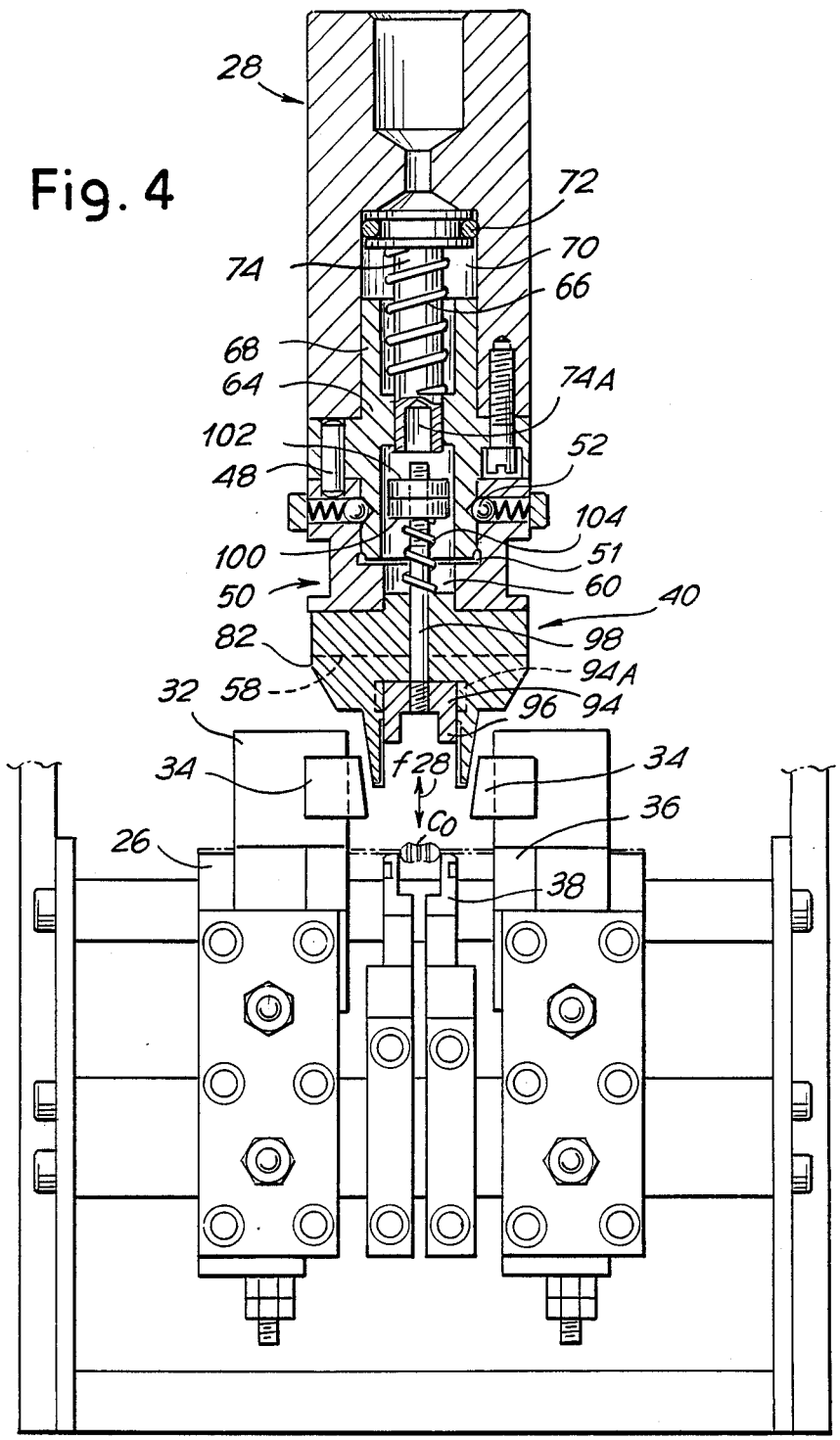
FIG. 4 shows an enlarged sectional view taken on line IV—IV of FIG. 2.

According to FIGS. 1 and 2, an advancement system is provided on a base, generally indicated by 11, which includes a number of fixed racks 13—especially saw tooth shaped—and at least two other mobile racks 15, all provided with the longitudinal pitch between the teeth—according to arrow fc—equal to the pitch between the components C engaged with the tapes N. The racks 15 are one-pitch movable with alternative displacements and in vertical direction to pass the teeth of the fixed racks 13. The electronic components may be electrically controlled along the trajectory according to arrow fc, by providing contacts 17 which can be lifted or lowered relative to contrasting elements 17A for elastically pressing the rheophores R and thus providing the above mentioned control in a per se known manner; these contacts 17 may be mounted on support means provided on a structure 19 overhanging the one indicated by 11. The structure 19 may also include a pair of bending tools, vertically movable and cooperating with underlying, fixed, contrasting counterdies 23 to provide the rheophores with folds R1, when these are required at limited distance from the body C of the electronic component in order to keep the component C lifted from the card C on which the component is to be applied. These tools 21 can be easily excluded.

The apparatus comprises only one station which allows to effect simultaneously: the shearing to measure of the rheophores R with separation from the connecting tapes N; the bending of the rheophores each through substantially 90° respect to their axial development, in order to present end lengths parallel and spaced with predetermined interspace and position respect to component C; and the engagement of the thus shaped component by means of the tool which has bent it to effect the transfer and insertion of the component with the lengths of the rheophores R, bent and parallel to each other, into the holes F provided on the card S for the component in question. Number 26 indicates a lower structure for supporting cutting members which are intended to cooperate with control, bending and clamping members which are provided in a mobile head 28 connected to an arm of a manipulator or of a "robot" being associated with the present apparatus. In correspondence of the cutting and shaping position, the head 28 is arranged to be vertically moved according to arrow f28. In the structure 26, vertical guides 30 are formed, provided for sliding and guiding columns 32 of set-cutters 34, which project horizontally from the guide columns in order to overhang—on the two sides of the row of components C—the rheophores R of the component C to be cut and shaped and be picked up in the position arranged for the above operations. In the structure 26, fixed contrasting members 36 are provided which are intended to cooperate with the cutters 34 for shearing the rheophores R inside the tapes N. By the transversal adjustment of the supports for cutters 34 and of the contrasting members 36, it is possible to change the rheophore lengths according to requirements.

In the shearing and bending position, within the zone delimited by the two cutters 34, two symmetrical, replaceable, supporting and contrasting members 38 are provided which are spaced apart—at the top active part—of a distance D being sufficient to contain the component C, while at the outside, each of them has a rounded corner 38B which defines the bending profile of the rheophore R which is pressed thereon. Each member 38 has also a recess 38C for receiving the possible folds R1 which may be made on the two rheophores R, when these come close to the shearing and shaping position.

The head 28 is predisposed to receive a replaceable tool representing a mobile hand generally indicated by 40. The mobile hand tool 40 is apt to be withdrawn and engaged by the head 28 of the robot's arm and to be sent back by same head to be stored. The head 28 includes also a linear drive system for the tool or mobile hand.

More particularly, number 42 indicates the end of the mobile arm of the robot making up the head 28. With this end 42 a terminal element 44 having an appendix 46 for the insertion of the tool 40, may be engaged, the tool 40 being correspondingly supplied with a seat for said appendix 46. A side pin 48 is provided for the angular centering of the tool 40. The tool 40 has a body 50 with said seat 51 for the appendix 46 and with elastic pegs 52 which may be jut into the seat 51 to effect a retaining function in cooperation with an annular throat hollowed out in the external surface of the appendix 46. A housing is provided in the piece 50 to receive the pin 48 for the angular centering. The piece 50 has tangential flat surfaces 54 which allow the piece 50—and, hence, the assembly of the tool or mobile hand 40—to be received in the tools store and to be picked up from it with horizontal sliding movements; the engagement of the piece 50 is obtained by inserting the appendix 46 into the seat 51 of piece 50 with a vertical movement and by withdrawing it from said seat, by overcoming—in one direction or the other—the thrusts operated by the elastic pegs 52; these elastic pegs allow to retain the tool or mobile hand 40 on the robot's arm during the operation to be performed by the same tool. The piece 50 has a diametral channel 58 which is to receive the working members of the mobile hand. A central hole 60 develops between the channel 58 and the seat 51. In the appendix 46 and the element 44 a cylindrical space 62 is formed being delimited on top by a shoulder 64 for a spring 66. The end element 44 forms a shank 68 which goes into a cylindrical hole 70 of a fluid-operated (and especially pneumatically operated) cylinder-piston system housed or formed in the end 42 of the robot's arm. Numeral 72 indicates the piston of this system, against which the spring 66 acts to lift the same piston in contrast with the fluid action. The stem 74 of the piston 72 reaches the cavity 62 and has an axial hole 74A at its end.

In the channel 58 a bending member 83, substantially laminar, is securely housed—being engaged by set-screws 80—which member has a wide, lower, central groove 84 from which a longitudinal hole 86 extends. The groove 84 is flanked by two symmetrical appendixes 88, which are externally tapered downwards and towards the center and are internally parallel; each appendix 88 has a channel 90 with concave cross-section profile able to receive the wire of the rheophore R. At the top each channel 90 ends with a tapering 90A and at the bottom each channel corresponds to a transversal recess 92 jointed to the respective channel 90 through a not very rounded corner 90B. At the bottom, the appendixes have reduced thickness. Within the central groove 84 a sliding block 94 is received which is guided between the two parallel facing inner edges of the appendixes 88 which define in part said groove 84. The block 94 has two external through-slots 94A to allow the guide along appendixes 88, and has also two lower projections 96 exactly aligned with the slots 94A and, thus, with the inner parallel profiles of the groove 84; the two projections 96 are internally spaced for an amount nearly corresponding to the interspace D between the upper ends of the two supporting and contrasting members 38. This distance D is greater than or at least equal to the longitudinal dimension of the body C of the electronic axial component to be handled. The block 94 engages a stem 98 which goes through the hole 86 of the bending member 82 and reaches the cavity 62. The stem 98 is threaded on its top to engage two nut and lock nut elements 100 and 102 to make up an adjustable ledge along the stem 98. The assembly of the mobile unit made up of the sliding block 94, stem 98 and ledge 100, 102 is urged by a small spring 104 resting on the bending member 82, 88; the stem 98 may be housed in the axial hole 74A of the stem 74 of piston 72. The piston 72 acts on the adjustable ledge 100, 102 to lower the block 94 together with its thrust projections 96; the adjustment of the ledge 100, 102 permits to define at will the travel to be imposed to the unit 94, 96, 98 until the piston 72 comes to rest on the shank 68 of piece 64.

Figure 5:
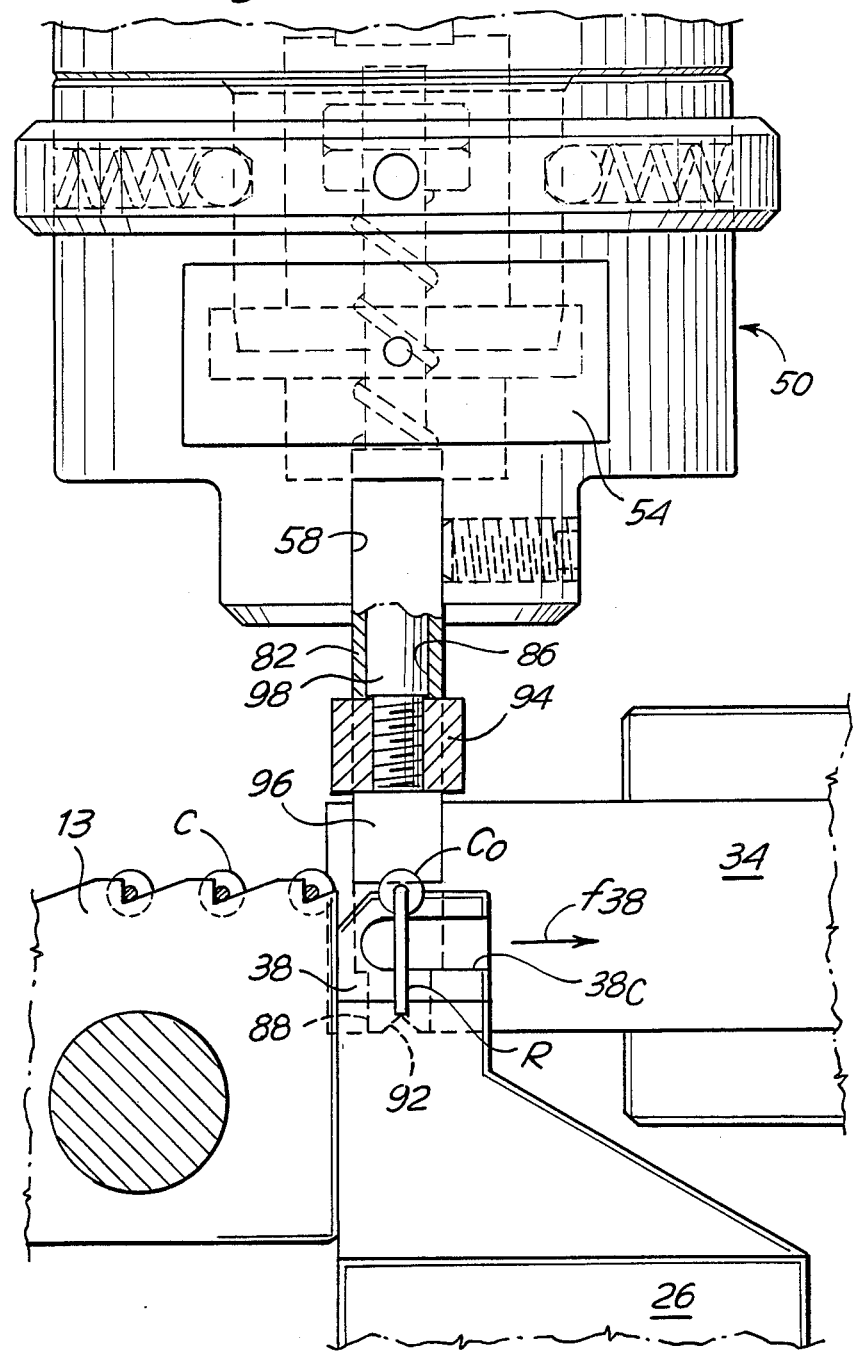
FIG. 5 shows an enlarged and partly cutaway detail of FIG. 2.
Figure 6:
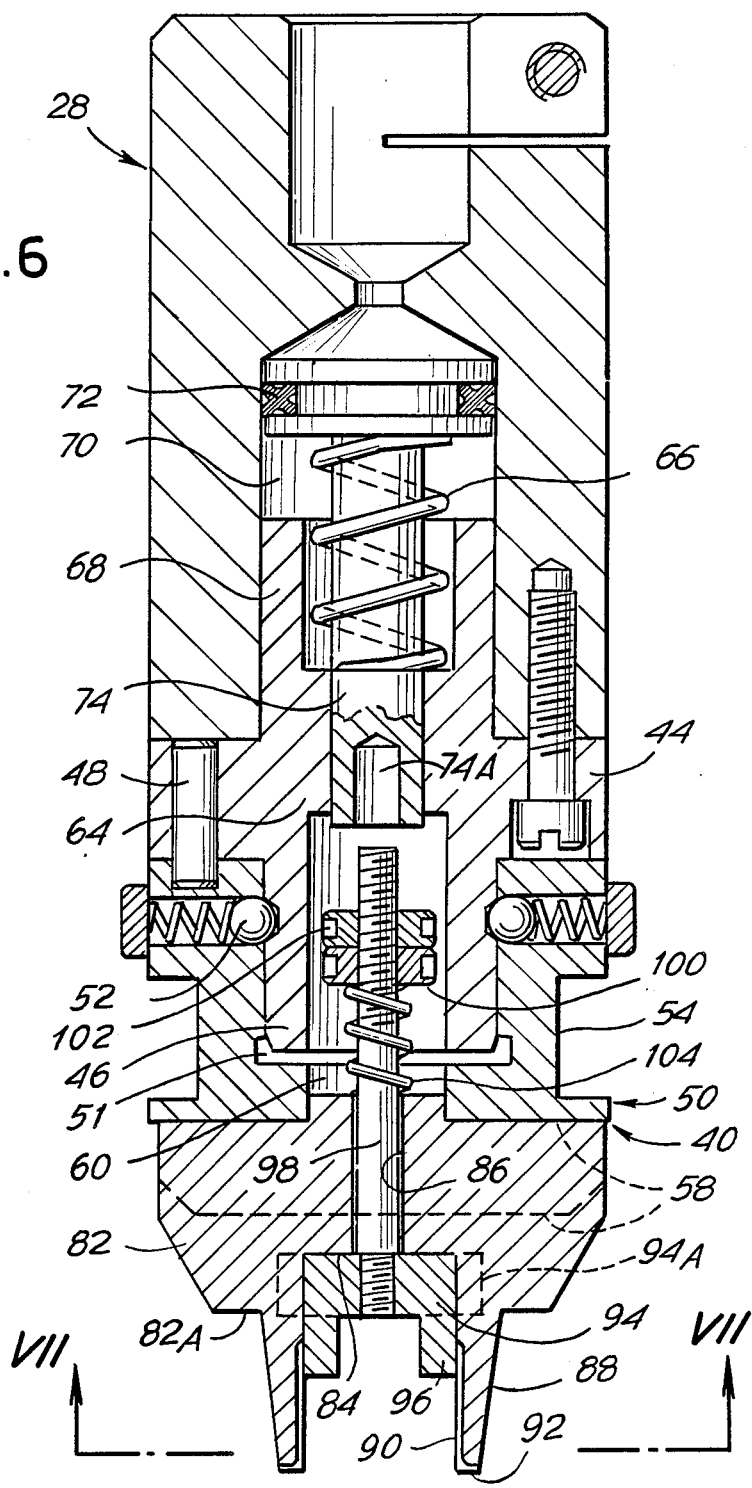
FIG. 6 shows an enlarged detail of FIG. 4.
Figure 7:
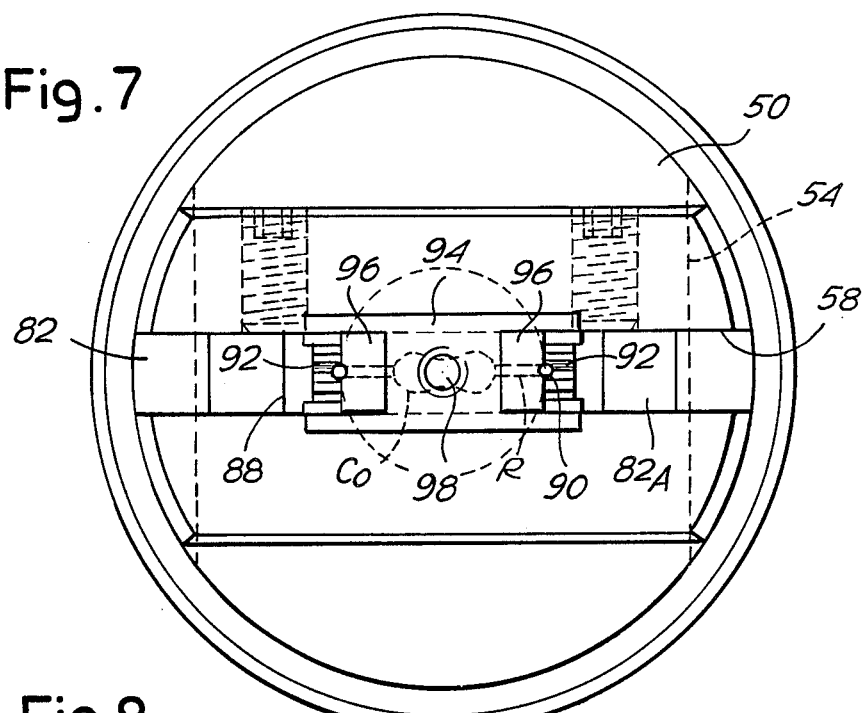
FIG. 7 shows an enlarged view on line VII—VII of FIG. 6.
Figure 8:
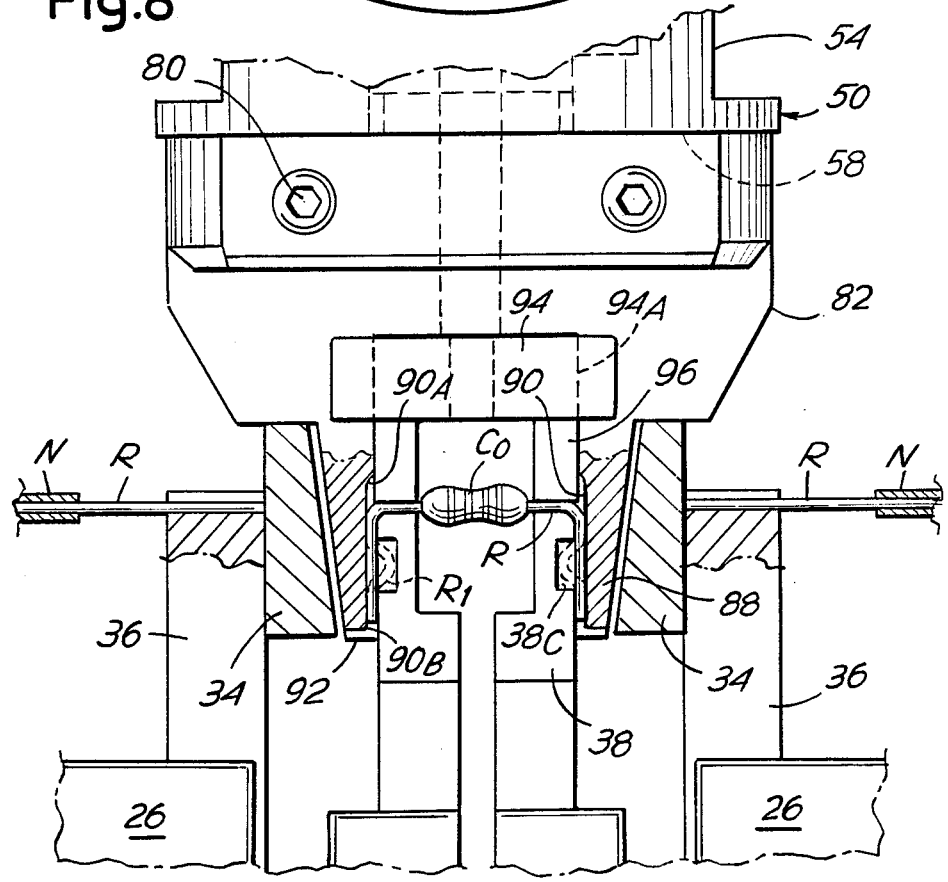
FIG. 8 shows an enlarged detail of FIG. 4, in the situation when the shearing and bending operations have been completed.
Figure 9:
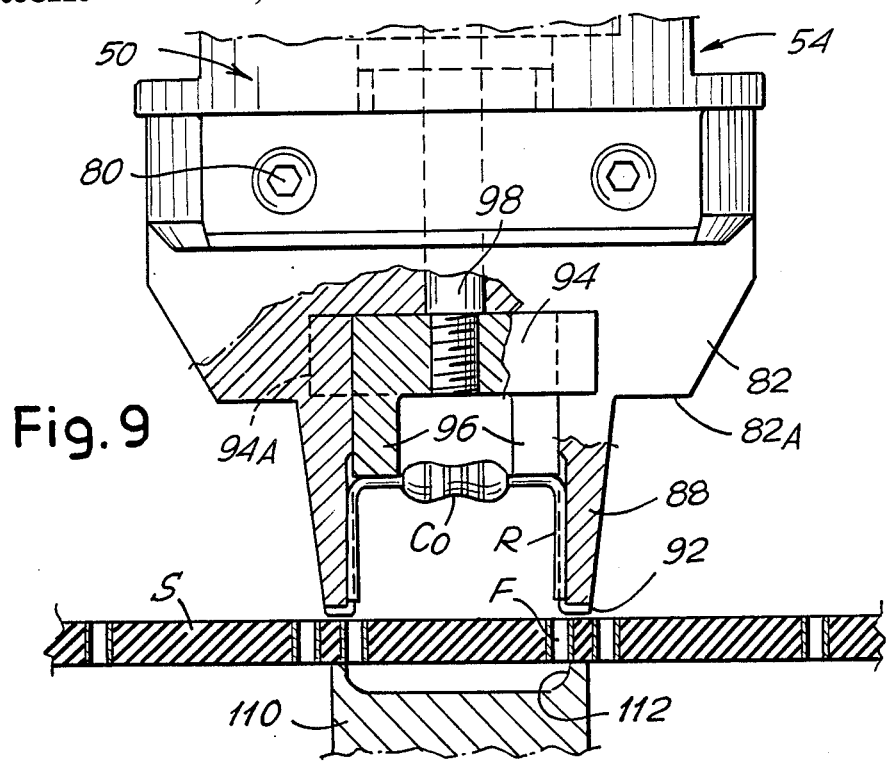
FIGS. 9 and 10 show two applying operation steps of the component on the printed circuit card.

The above described tool or mobile hand 40 which is able to be engaged by the end of the robot's arm, that is, by the head 28, is capable of coacting with cutters 34, with the contrasting members 38 and with the tape of components C in order to operate the shearing of rheophores R (possibly completed with folds R1) and their bending, so as to make the component C and its rheophores R assume the necessary arrangement (FIG. 1) for the application into the holes F of the card S. To put this into practice, when the component C to be sheared and bent is in the position $C_O$, the rheophores are located on the upper end of the contrasting members 38 as well as on the supporting and contrasting members 36 which are intended to cooperate with the cutters 34. When the head 28 and tool 40 carried by same head have lowered, the shoulders 82A which flank the appendixes 88 of the bending member 82, firstly come in contact with the upper edges of cutters 34 and determine their lowering until causing the cut of the two rheophores R at the right distance necessary to attain their final arrangement. Soon after, the appendixes 88 encounter the rheophores R in correspondence of the transversal recesses 92 which center the rheophores R in the correct cutting and bending position. Upon their lowering, the appendixes 88 reach and pass the adjacent rounded corners 38B so that the wires made of copper or other plastic metal of rheophores R are bent for the cooperation of corners 90B, channels 92, corners 38B and channels 90 of the inner edges of the appendixes 88, thereby causing the bending of the rheophores and their arrangement so as to be perfectly guided first by the recesses 92 and then by the channels 90 and between the channels 90 and the contrasting members 38; possible folds R1 are received—upon bending—into the recesses 38C. The lowering of tool 40 may be prolonged until the body C of the electronic component is located between the two projections 96 of the block 94 (FIG. 8) being kept lifted in abutment against the bottom of the groove 84 by the spring 104; in this arrangement, the initial length of each rheophore R coming out of the body C is located in front of the corresponding projection 96. The tool 40 is caused to translate horizontally, under these conditions, according to f38 (FIG. 5), in order to make the folds R1 come out of recesses 38C and, then, said tool is moved by the robot until it finds itself above the holes F of the card S (FIG. 9); in these holes the rheophores, bent parallel between them, must be inserted, the insertion having to be operated at least as far as the fold R1 or until the body C of the axial component comes in contact with the card.

To carry out this operation, the tool 40 is brought, with the member 82 and, in particular, with the ends of the appendixes 88, to rest, or nearly so, on the card S just outside respect to the pair of holes F. In this way, the ends of the rheophores R result perfectly aligned with the holes F as the folded parts and the end parts of the rheophores are retained and guided by the channels 90.

It should be noted that the component C with the folded rheophores R is firmly held by the tool 40 owing to the friction that the rheophores R exert on the channels 90 for the residual elasticity which tends to spread apart the rheophores—bent by the appendixes 88—in such a direction as to be spaced out from each other while this spacing is opposed by the channels 90, in order to exert a suitable friction on the same rheophores; no clamping means is thus necessary having mobile parts and to be driven on the tool which is carried by the robot's arm. As a result, a very great simplification and reduction of overall dimensions is achieved of the tool, respectively of each tool prearranged for handling an axial component to be mounted on the card.

After positioning the tool 40 with the appendixes 88 in correspondence of holes F (FIG. 9), the cylinder-piston system 72 is actuated that lowers the stem 64 and, after coming to rest upon ledge 100, 102, lowers, in turn, the stem 98 and the block 94 so that the projections 96 act more or less axially on the parallel lengths of rheophores R to push them into holes F (FIG. 10), said rheophores being kept and guided by channels 90 until they enter the mouth-piece of holes F.

The thrust by projections 96 on the parallel lengths of the two rheophores is exerted almost in alignment with these lengths, and thus in axial direction under such conditions, as to be able to exert even a substantial thrust on the rheophores. This circumstance is exploited to operate—if required—a deformation of the ends of rheophores R which have possibly passed beyond the holes F of card S. To this purpose, below the card (or, however, at the opposite side of tool 40 respect to the card), a contrasting member 110 is provided, in correspondence of holes F, with shaped profiles 112 against which the rheophores ends come in contact; these ends are thereby deformed, as indicated by Ro, in a manner more or less limited but, at any rate, sufficient to surely retaining the component on the card during the handling of card S, even before the welding of the rheophores to the printed circuit.

The overall dimensions due to the appendixes 88 are very small so that components which are even very close to each other can be placed on the card as well.

From what has been hereinbefore described, it is evident that in the only one station at the end of the assembly fed by the tapes N, both the cutting and bending of the rheophores are carried out, while the engagement is also obtained on the tool which is transferred into the second position to operate the positioning of the component on the card. The tool transferred by the robot has only one direct control of its sliding movement that is therefore of simply realization and of limited overall dimensions. The presence of the cutters in the fixed part of the machine avoids the overall dimensions of them in the tool movable with the robot operation. The restraint of the withdrawn component is due directly to the effect of the cutting and bending operations carried out without any clamp or other gripping means, with further simplification of the tool which is to be moved by the robot. The component results so engaged as to be perfectly guided by channels 90 thereby ensuring an accurate insertion into even very precise card holes, and also at a very high speed. These and other advantages will be apparent to those skilled in the art.

With rheophores having relatively large diameters, the cutters 34 may be lowered by a servomechanism actuated by the lowering of the mobile hand that is, not obliged therefore, to generate the cutting force directly.

FIGS. 23 to 26 show a useful and practical device in place of the device of the preceding example for obtaining the advancement of the tape of pieces to be fed and for shearing the wires of said rheophores. The device is directly driven by the head of the tool carried and maneuvered by the robot's arm instead of being driven autonomously as in the preceding embodiment.

According to FIGS. 23 to 26, number 501 indicates slide and support guides for the pieces P to be fed and which are carried by two adhesive tapes N on which the ends of the wires or rheophores C are engaged at fixed and constant distances. By 503 there are indicated centering side boards for the tape N. The tape N tape must be caused to advance according to arrow $f_P$ to make a piece P reach every time a position PX, CX defined by countercutters 505 provided with V-shaped recesses. With countercutters 505 the cutters 507 must cooperate that have to move according to arrow $f_T$ for the cutting operations. Both the cutters and countercutters are adjustable in interspace so as to cut the wires C at the desired length. The device may be completed by tools which permit the bending of the ends of the cut wires.

The two cutters are mounted on a slide 509 slidingly guided in the direction $f_T$ perpendicular to the advancement direction of the tape of pieces P. This slide is guided in a sliding seat of the structure 511 completed with a closing plate 513 which is supplied with a slit for a guide peg 515 solid with the slide; by means of the peg 515 it is possible to define the maximum lift of slide 509.

On the structure 511 a transversal pivot 517 is mounted which is intended to swing a rocker lever 519; this lever has, at one end, a contact roller 521 cooperating with the lower end of the slide 509; close to said roller a pair of tensile springs 523 acts on the lever 519, said springs tending to press the roller 521 on the slide and to urge upwards the same slide. At the end of the lever 519, opposite to the one carrying the roller 521, a crosspiece 525 is provided, fixed to said end and projecting with two side pegs 527 for the hooking of two springs 529 which are weaker than those indicated by 523; also springs 529 are tensile springs and are hooked at the bottom to pegs 531 projecting from a double lever 533 also articulated to the pivot 531. The small springs 529 tend to keep the double lever 533 close to the crosspiece 525 for a joint movement of levers 519, 533. A displacement in the direction of arrow $f_L$ of the lever 519 about the pivot 517 causes, therefore, also the displacement of the double lever 533 through the springs 529, but a stopping of the double lever 533 permits a further displacement of the lever 519 with a stretching of springs 529. To the double lever 533 a strut 535 is articulated; at the upper end, said strut 535 is fork-like developed in order to engage, through a pivot 537, an arm 539 which oscillates for driving a device with unidirectional, angular advancement, that is, a so-called free wheel. This device is articulated on a fixed, transversal shaft 541 and is solid with the driving member of the free wheel device in order to perform a reciprocating angular movement for the action of arm 539. The driven member of the free wheel device is intended to move intermittently according to arrow $f_R$ always in the same direction about the axis of the shaft 541; two toothed wheels 543 making part of this member have a pitch corresponding to that of wires C on the tape to be fed; this pitch is also corresponding to the travel of the unitary intermittent advancement caused by the arm 539 which is driven by the articulation 539, 537, 535, 533.

With the perimetrical indentations of the two toothed wheels, at least an elastic peg 545 may cooperate, able to define the subsequent positions of these toothed wheels. Starting from the position shown on FIG. 23, in which the slide 509 is lifted from the spring 523, the lowering of spring 509 is provoked according to $f_T$ together with the angular displacement of lever 519 and, consequently, of the double lever 533, in the direction $f_L$; therefore, the arm 539 of the free wheel is driven and the two toothed wheels 543 are moved of one pitch in the direction of arrow $f_R$. The wheels 543 are so located as to engage the two wires C of pieces P which are to be fed in the direction of arrow $f_P$; through the unitary angular displacement of the toothed wheels 543 caused by the free wheel device, the tape of pieces P is made to advance of one pitch until a piece is brought in the position PX, CX on the countercutters 505, ready to be sheared and shaped. The travel of the arm 539 and thus of articulation 539, 537, 535, 533 may be set by an adjustable stop 547 which limits, as required, the travel of the driving member of the free wheel device, thereby cooperating with the peg 545 for the positioning of the pieces which move forward with the tape owing to the perimetrical indentations of said toothed wheels.

The action on the slide 509 in the direction of arrow $f_T$ may be prolonged, after the abutment on the ledge 547, with the yielding of springs 529; in this way, the downward travel of slide 509 may continue in order to operate, through the cutters 507 and the countercutters 505, the cut of the wires C of the piece just brought in the position PX, and the bending of the wires.

The action on the slide 509 according to arrow $f_T$ is operable by the tool carried by the robot's arm which must pick up the piece from the position PX after the shearing and deformation of wires C. It is thus possible to carry out, by means of the tool head of the robot, the control of the advancement of the pieces tape and the feeding of a piece into the position PX; this occurs with a very short advance respect to the cutting operation performed by the cutters 507 and to the other subsequent operations.

With the lift of the robot's tool head, the slide 509 may be lifted up again for the action of springs 503 which, at first, cause only the lever 519 to rotate in the opposite direction of arrow $f_L$ and, secondly, cause also the double lever 533 to bring back (in opposite direction to arrow $f_R$) the arm 539 of the driving member of the free wheel.

The lowering of slide 509 may cause further or different operations respect to the cut operation described in the example.

It should be understood that the drawing shows one exemplification given only as a practical demonstration of the invention as this invention may vary in the forms and dispositions without, nevertheless, coming out from the ambit of the concept on which the invention itself is based. The eventual presence of reference numbers in the accompanying claims has the purpose to ease the reading of the claims, reference being made to the description and drawing, and does not limit the protection field sought by the claims.

We claim:

1. Apparatus for assembling on printed circuit cards components having axially extending wire leads, comprising in combination: tools prearranged for cutting and bending said leads as well as engaging the resultant component, which tools operate at a common station, a mobile hand of a robot for carrying operatively some of said tools and for transferring said resultant component to a circuit card station for assembly to a circuit card, said tools to be carried by said mobile hand comprising a bending member with two appendixes constructed to cooperate with separate counterpart members mounted at said common station for bending said leads into parallel relationship, means at said common station for feeding said components to a work station, said two appendixes being constructed with confronting surfaces having guide and retaining channels terminating at the ends of said appendixes in channels for centering said leads, said appendixes being arranged for holding said resultant components with said parallel-bent leads resiliently pressing against said confronting surfaces, a slide block associated with said bending member for sliding movement along said bending member and said appendixes, an axial actuation system carried by said mobile hand and constructed to cooperate operatively with said slide block for moving the latter to urge said resultant component from said appendixes so as to introduce said leads into holes of said printed circuit card, a body engageable and disengageable by said mobile hand, said body having a channel-like seat for removably receiving said bending member, cooperating wire cutting elements mounted at said common station with a first part of said cutting elements fixedly supported and a second part mounted for counter-movement relative to said first part, and means associated with said second part which means are actuatable by said mobile hand as the latter approaches said common station to actuate said wire cutting elements prior to accomplishing said bending of said leads.

2. Apparatus according to claim 1, characterized in that said means for feeding said components to a work station comprises at least one toothed wheel which engages said components for advancing said components upon wheel rotation one tooth pitch at a time, an articulatory linkage coupled to said toothed wheel for causing unidirectional, intermittent, angular advancement of said toothed wheel, said linkage including first and second elements interconnected by elastic means for permitting overtravel of said first element while travel of said second element is limited to that corresponding to said one tooth pitch rotation of said wheel, and an adjustable stop for limiting the movement of said second element.

3. Apparatus according to claim 2, characterized in that said first and second elements of said linkage comprise first and second levers, respectively, both pivotally mounted on a common axis and interconnected by spring means to allow continuation of the angular displacement of said first lever about said common axis after said second lever has been halted by said adjustable stop.

4. Apparatus according to claim 3, characterized in that said components are carried by a tape to which said components are attached through lead portions that are removed by said cutting elements.

5. Apparatus according to claim 2, characterized in that said components are carried by a tape to which said components are attached through lead portions that are removed by said cutting elements.

6. Apparatus according to claim 1, characterized in that said components are carried by a tape to which said components are attached through lead portions that are removed by said cutting elements.

* * * * *